United States Patent
Hennequin et al.

(10) Patent No.: US 11,557,450 B2
(45) Date of Patent: Jan. 17, 2023

(54) METHOD FOR DIAGNOSING THE CAUSE OF TRIPPING OF AN ELECTRICAL PROTECTION DEVICE, AUXILIARY DEVICE AND ELECTRICAL SYSTEM FOR IMPLEMENTING SUCH A METHOD

(71) Applicant: Schneider Electric Industries SAS, Rueil Malmaison (FR)

(72) Inventors: Michel Hennequin, Crolles (FR); Wedian Youssef, Grenoble (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 716 days.

(21) Appl. No.: 16/514,325

(22) Filed: Jul. 17, 2019

(65) Prior Publication Data
US 2020/0105490 A1 Apr. 2, 2020

(30) Foreign Application Priority Data
Sep. 28, 2018 (FR) ...................... 18 58967

(51) Int. Cl.
*H01H 71/04* (2006.01)
*G01R 31/327* (2006.01)
*H01H 71/12* (2006.01)

(52) U.S. Cl.
CPC ......... *H01H 71/04* (2013.01); *G01R 31/3274* (2013.01); *G01R 31/3275* (2013.01); *H01H 71/125* (2013.01); *H01H 2071/042* (2013.01)

(58) Field of Classification Search
None
See application file for complete search history.

(56) References Cited

U.S. PATENT DOCUMENTS

| 2013/0314057 A1* | 11/2013 | Jernstrom | H02J 3/18 323/217 |
| 2015/0070020 A1 | 3/2015 | Michaux et al. | |
| 2015/0070026 A1* | 3/2015 | Vincent | H02H 3/10 324/522 |
| 2015/0346266 A1* | 12/2015 | Dimino | G01R 31/086 702/59 |

FOREIGN PATENT DOCUMENTS

| FR | 3 010 531 A1 | 3/2015 |
| FR | 3 010 584 A1 | 3/2015 |

OTHER PUBLICATIONS

French Preliminary Search Report dated May 27, 2019 in French Application 18 58967, filed on Sep. 28, 2018 (with English Translation of Categories of Cited Documents & Written Opinion).

* cited by examiner

*Primary Examiner* — Nasima Monsur
(74) *Attorney, Agent, or Firm* — Oblon, McClelland, Maier & Neustadt, L.L.P.

(57) ABSTRACT

A method for diagnosing the cause of tripping of an electrical protection device includes, after detection by the auxiliary device of a loss of electrical power, determining a type of electrical fault on the basis of recorded values, the determining operation including: comparing, with a first threshold value, the largest value of the maximum intensity of the current from the recorded values for a plurality of measurement intervals preceding the loss of power, a short circuit being diagnosed if the largest value of the maximum intensity is greater than a first threshold value; comparing, with a second threshold value, the largest RMS value of the current from the recorded values, an overload being diagnosed if the largest RMS value is greater than a second threshold value.

14 Claims, 5 Drawing Sheets

METHOD FOR DIAGNOSING THE CAUSE OF TRIPPING OF AN ELECTRICAL PROTECTION DEVICE, AUXILIARY DEVICE AND ELECTRICAL SYSTEM FOR IMPLEMENTING SUCH A METHOD

The present invention concerns a method for diagnosing the cause of tripping of an electrical protection device. The invention also concerns an auxiliary device and an electrical system for implementing such a diagnostic method.

Electrical installations generally include one or more electrical protection devices such as circuit-breakers to interrupt the circulation of the electrical current in one or more electrical conductors of the installation in the event of detecting an electrical fault in the installation such as a short circuit or an overload.

To this end, the protection device includes a tripping device adapted to detect one or more electrical faults and in response to switch the protection device to an electrically open state.

When the protection device is tripped, it is desirable to be able to identify the type of electrical fault that led to tripping, because that facilitates management and supervision of the electrical installation.

This is why auxiliary devices are sometimes added alongside the protection device in order to provide surveillance and diagnostic functions without it being necessary to replace completely the protection devices already installed.

The surveillance and diagnostic functions are typically executed on the basis of measurements of electrical parameters by the auxiliary devices, for example as described the document EP-2849196-B1.

However, in some circumstances, the diagnoses made by the auxiliary devices may be erroneous.

It is these disadvantages that the invention more particularly aims to remedy by proposing a method for diagnosing the cause of tripping of an electrical protection device, an auxiliary device and an electrical system for implementing such a diagnostic method.

To this end, the invention concerns a method for diagnosing the cause of tripping of an electrical protection device, the method including:
  measuring the intensity of an alternating electrical current circulating in at least one electrical conductor in an electrical installation including an electrical protection device, by means of a current sensor of an auxiliary device associated with the electrical conductor;
  an electronic processing unit of the auxiliary device calculating values representing the measured electrical current, said representative values being each calculated from intensity values measured during a predefined time interval, the values representing the electrical current including the maximum intensity of the measured current et and the RMS value of the measured current;
  storing the calculated values in a memory of the auxiliary device;
  the measurement, calculation and storing being carried out repeatedly for as long as an electrical current circulates in said electrical conductor.

According to the invention, the method includes, after detection by the auxiliary device of a loss of electrical power in said electrical conductor, determining a type of electrical fault from the stored values, such determination including:
  comparing with a first threshold value the largest value of the maximum intensity of the current from the stored values for a plurality of measurement intervals preceding the loss of electrical power, a short circuit being diagnosed if the largest value of the maximum intensity is greater than the first threshold value;
  comparing with a second threshold value the largest RMS value of the current from the stored values for a plurality of measurement intervals preceding the loss of electrical power, an overload being diagnosed if the largest RMS value is greater than a second threshold value.

Thanks to the invention, the cause of tripping of the protection device may be diagnosed by an auxiliary device independent of the protection device.

Implementing the diagnostic function on existing installations is therefore facilitated, since that function may be integrated simply by adding the auxiliary device and without having to replace all or part of the protection devices.

Furthermore, the reliability of the diagnosis of the cause of tripping is improved.

According to advantageous but non-obligatory aspects of the invention, such a diagnostic method may incorporate one or more of the following features, separately or in any technically permissible combination:
  The first threshold value is calculated automatically, after detection of the loss of electrical power, as a function of the maximum intensity values of the measured current previously stored for a plurality of time intervals preceding the detection of loss of electrical power.
  Calculating the first threshold value includes:
    determining the largest value of the maximum intensity of the current from the maximum intensity of the current among the values stored for a plurality of time intervals preceding the loss of electrical power;
    determining the smallest value of the maximum intensity of the current from the values stored for a plurality of time intervals preceding the loss of electrical power;
    calculating the mean value between the smallest value and the largest value determined from the maximum intensity of the current, the first threshold value being defined as equal to the calculated mean value.
  When calculating the first threshold value, the stored values of the maximum intensity of the current that are associated with time intervals after the time interval corresponding to the largest value determined of the maximum intensity of the current are ignored for determining the smallest value, the smallest value of the maximum intensity of the current being determined from only the stored values corresponding to the time intervals before the time intervals corresponding to the largest value determined.
  When determining a type of electrical fault, no short circuit is diagnosed if the largest value determined of the maximum density of the current is less than twice the smallest value determined of the maximum intensity of the current.
  When determining a type of electrical fault, a short circuit is diagnosed only if, additionally, the largest value of the maximum intensity of the current among the values stored for a plurality of time intervals preceding the loss of electrical power is greater than or equal to twice the rated current value of the protection device.
  The second threshold value is higher than the rated current value and less than twice said rated current value of the protection device.
  When determining a type of electrical fault has led to detecting both a short circuit and an overload, only the detection of the short circuit is taken into account, the detection of the overload then being automatically ignored in this case.

The method includes, when detecting an overload current type electrical fault, storing in a memory of the auxiliary device the largest value of the RMS value of the current.

The method includes, after determining the type of electrical fault, sending a diagnostic message representing the type of electrical fault determined to a concentrator by means of a wireless communication interface of the auxiliary device and/or storing in a memory of the auxiliary device diagnostic information representing the type of electrical fault determined.

The duration of the time intervals is proportional to the period of the alternating electrical current circulating in said electrical conductor.

According to another aspect, the invention concerns an auxiliary device for an electrical installation including an electrical protection device associated with at least one electrical conductor, the auxiliary device including a current sensor associated with the electrical conductor, an electronic processing unit and at least one memory, the electrical device being configured to employ a method for diagnosing the cause of tripping of the electrical protection device conforming to the above description.

According to a further aspect, the invention concerns an electrical system including an electrical protection device and an auxiliary device associated with at least one electrical conductor of an electrical installation, the electrical protection device being able to interrupt the circulation of an electrical current in the electrical conductor in the event of detecting an electrical fault, the auxiliary device being a device according to the above description.

The invention will be better understood and other advantages thereof will become more clearly apparent in the light of the following description of one embodiment of a diagnostic method given by way of example only and with reference to the appended drawings, in which.

Figure 1:
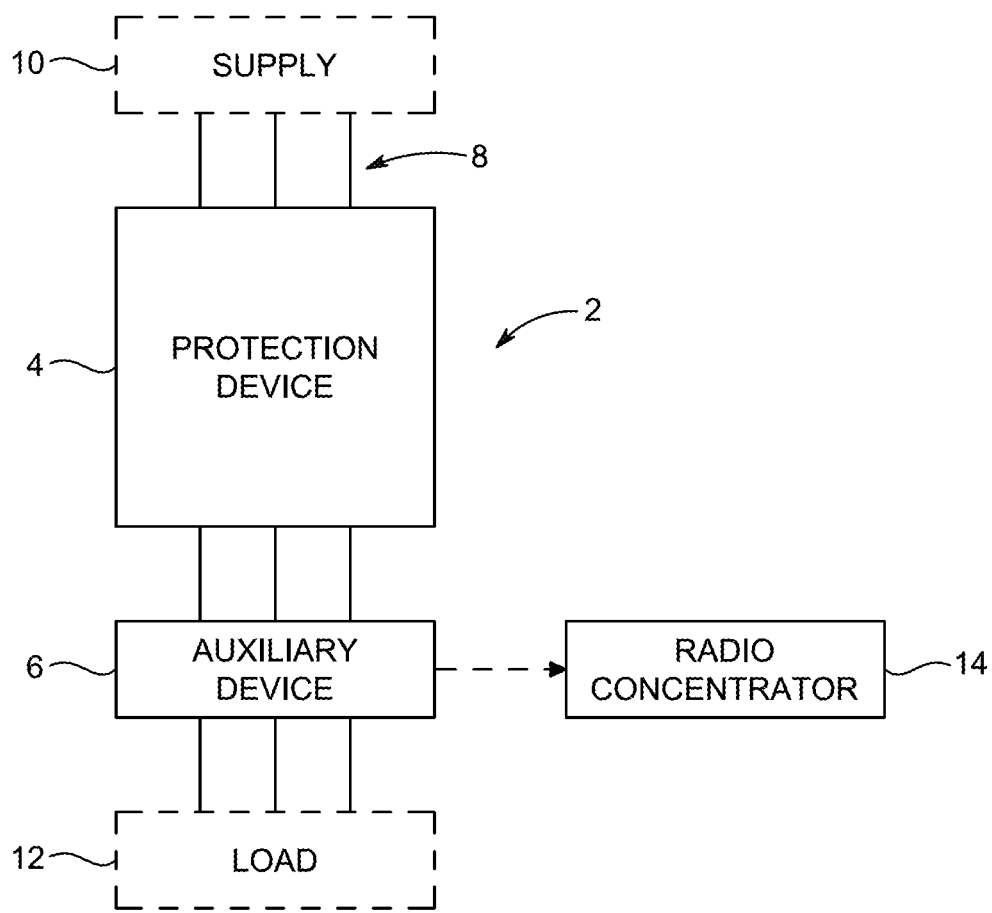
FIG. 1 is a diagrammatic representation of an electrical installation including an electrical system according to embodiments of the invention.

FIG. 1 shows an electrical installation 2 including an electrical protection device 4 and an auxiliary device 6. One or more electrical conductors 8 electrically connect an electrical supply 10 to an electrical load 12.

The protection device 4 and the auxiliary device 6 are associated with the electrical conductors 8 of the installation 2.

By way of illustrative example, the supply 10 includes a generator or a mains type grid.

For example, the electrical installation 2 is an electricity distribution installation. The conductor or conductors 8 enable(s) an alternating electrical current to be routed between the supply 10 and the load 12.

According to embodiments, the installation 2 may be a single-phase or multi-phase installation.

In the example shown, three conductors 8 are shown, for example to form a three-phase grid adapted to supply a three-phase electrical current.

However, to simplify the description, the embodiments are described only with reference to a single pole or phase of the installation 2. It is nevertheless clear that what is described hereinafter may be transposed to each of the other poles or phases of the installation 2 and may be generalized to other situations not expressly described, such as a single-phase grid or a four-pole grid (three-phase and neutral).

According to examples, the protection device 4 is a circuit-breaker or any equivalent electrical protection device.

The device 4 is connected in series with the conductors 8 and enables circulation of the electrical current in the conductors 8 to be interrupted, in particular in the event of detecting an electrical fault in the installation 2, such as a short circuit or an overload affecting one or more phases of the installation 2.

To this end, the device 4 includes a tripping device, not shown, for detecting this kind of electrical fault and responding by forcing switching of the device 4 to an electrically open state to interrupt the circulation of the current.

According to different embodiments, the tripping device is an electronic device or a thermomagnetic device.

According to examples, the device 4 also includes a control member, such as a lever, that can be actuated by a user of the device 4 to switch the device 4 manually between its open and closed states.

The auxiliary device 6 is associated with the device 4 to implement functions of surveillance and of supervision of the installation 2 and the device 4.

The device 4 and the device 6 together form an electrical system.

Here the device 6 is coupled to the conductors 8, for example by being placed downstream of the device 4.

According to embodiments, the components of the auxiliary device 6 are housed in a unit distinct from that of the device 4. The devices 4 and 6 are for example mounted on an electrical board or in an electrical cabinet.

According to advantageous but nevertheless optional embodiments, the auxiliary device 6 is also adapted to communicate via a wireless link with a radio concentrator 14 placed in the vicinity of the installation 2.

The device 6 is in particular able to measure the intensity of the electrical current in one or more conductors 8 of the installation 2 and to this end includes one or more current sensors.

Each current sensor is preferably associated with one of the phases of the installation 2 and therefore with one of the conductors 8.

Figure 2:
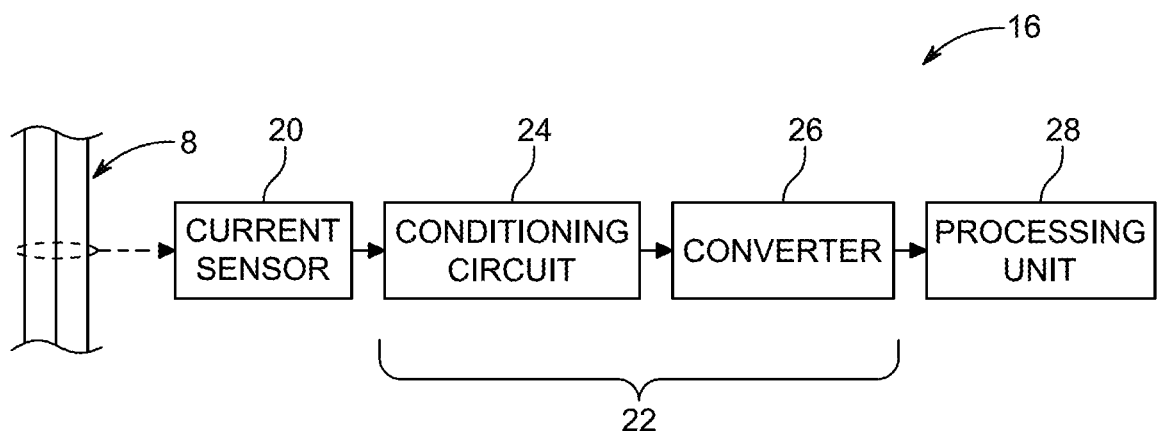
FIG. 2 is a diagrammatic representation of a measurement subsystem of an auxiliary module of the electrical system from FIG. 1.

FIG. 2 shows an example of a measurement subsystem 16 implemented by the device 6 for measuring the electrical current or currents.

The device 6 in particular includes a current sensor 20 associated with a conductor 8.

According to embodiments, the current sensor 20 includes a Rogowski coil or a Hall-effect sensor or a measurement shunt or any other equivalent current sensor.

In the example shown, the device 6 further includes a circuit 22 for acquisition of the measurement signal that includes for example a conditioning circuit 24 and an analogue-digital converter 26.

The conditioning circuit 24 is for example for providing filtering and/or amplification and/or electrical isolation functions for the measurement signal upstream of the converter 26.

The device 6 also includes an onboard electronic processing unit 28 configured to execute a method of diagnosing the cause of tripping of the device 4 as a function of the current measurements carried out by the sensor or sensors 20.

Here the measurement subsystem 16 is described with reference to only one phase of the installation 2 but it is clear that the current measurements may be carried out independently for each of the phases. The device 6 includes as many sensors 20 as necessary, for example as many sensors 20 as conductors 8 requiring surveillance. Some components of the device 6, in particular the processing unit 28, are preferably common to a plurality of measurement subsystems 16. Here the device 6 includes a processing unit 28.

Figure 3:
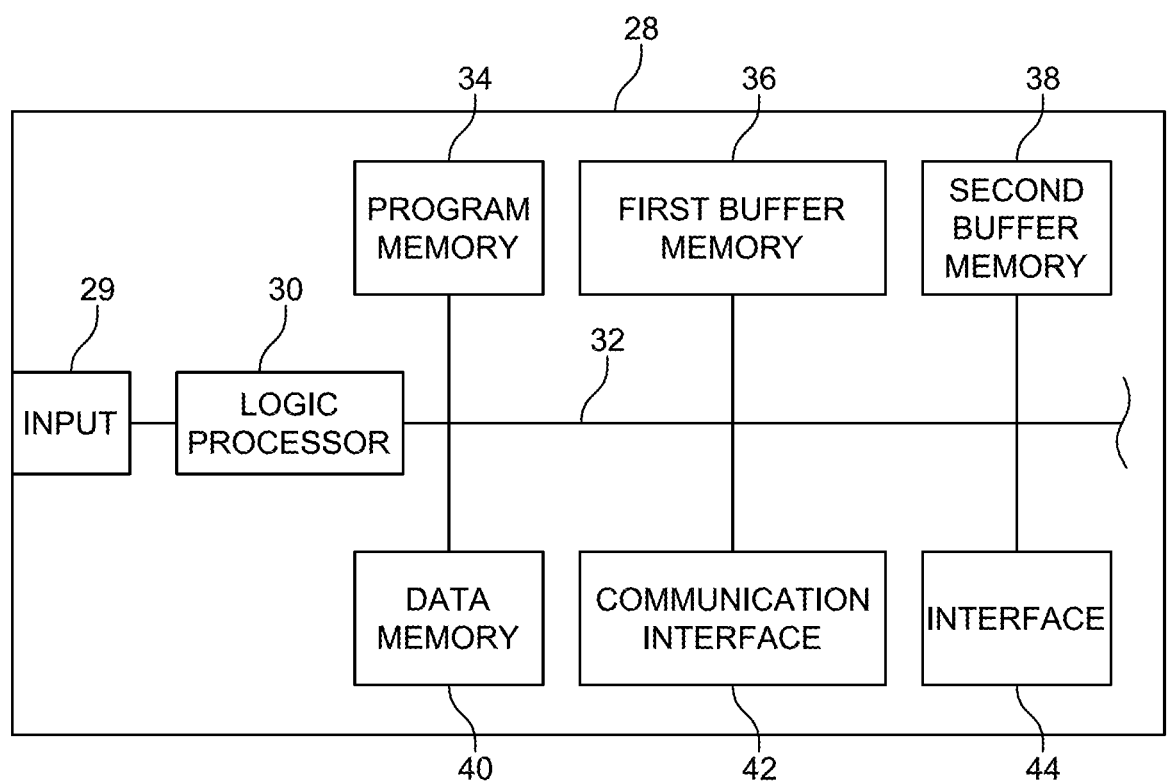
FIG. 3 is a diagrammatic representation of an electronic processing unit used in the measurement subsystem from FIG. 2.

FIG. 3 shows an example of the processing unit 28.

The unit 28 includes an input 29 for receiving a measurement signal delivered by a sensor 20. The input 29 is connected to the output of the converter 26 for example.

The unit 28 also includes a logic processor 30 (central processing unit (CPU)) and further includes, connected to the processor 30 by an internal data bus 32, one or more computer memories 34, 36, 38, 40, a user control interface 42 and a wireless communication interface 44.

Alternatively, the unit 28 may be produced differently, for example omitting the interface(s) 42 and/or 44.

According to examples, the processor 30 is a programmable microcontroller or a microprocessor or a digital signal processor (DSP). Alternatively, the processing unit 28 includes a programmable logic component of FPGA type or a dedicated integrated circuit.

The processor 30 is connected to the input 29 and receives the measurement signals sent to the input 29 by the measurement subsystem 16.

According to embodiments, the memory is a ROM or a RAM or an EPROM or an EEPROM or a FLASH or an NVRAM non-volatile memory or an optical or magnetic memory. For example, the memories form computer-readable non-transitory information storage media.

According to examples, the memory 34 contains executable instructions and/or software code for executing a diagnostic method as described hereinafter when those instructions and/or that code are executed and/or interpreted by the processor 30.

The memories 36 and 38 here form first and second buffer memories, respectively. The memories 36 and 38 are preferably circular buffer memories in particular adapted to store a predefined number of digital values.

The memory 40 enables storage of data for subsequent access by a user for example. That data may include information representing a diagnosis made by the unit 28 according to the method described hereinafter.

In the FIG. 3 example, the memories 34, 36, 38 and 40 are shown as being separate to simplify the description but in practice other constructions are possible and the memories are not necessarily physically separated. For example, the memories 34, 36, 38 and 40 may be implemented in the same physical memory of the unit 26. The buffer memories 36 and 38 may be implemented by data structures stored in the same physical memory. The memories 34 and 40 may be implemented in the same physical memory.

According to examples, the interface 42 enables exchange of information between the unit 28 and an external user. The interface 42 may therefore include one or more of the following devices: an indicator light, a display screen, a data port.

According to embodiments, the interface 44 includes a transmitter-receiver circuit and a radio antenna coupled to the transmitter-receiver circuit.

According to examples, the device 6 may also include electrical power supply means, not shown, such as a reserve of energy of battery type or a current transformer coupled to the conductors 8.

Figure 4:
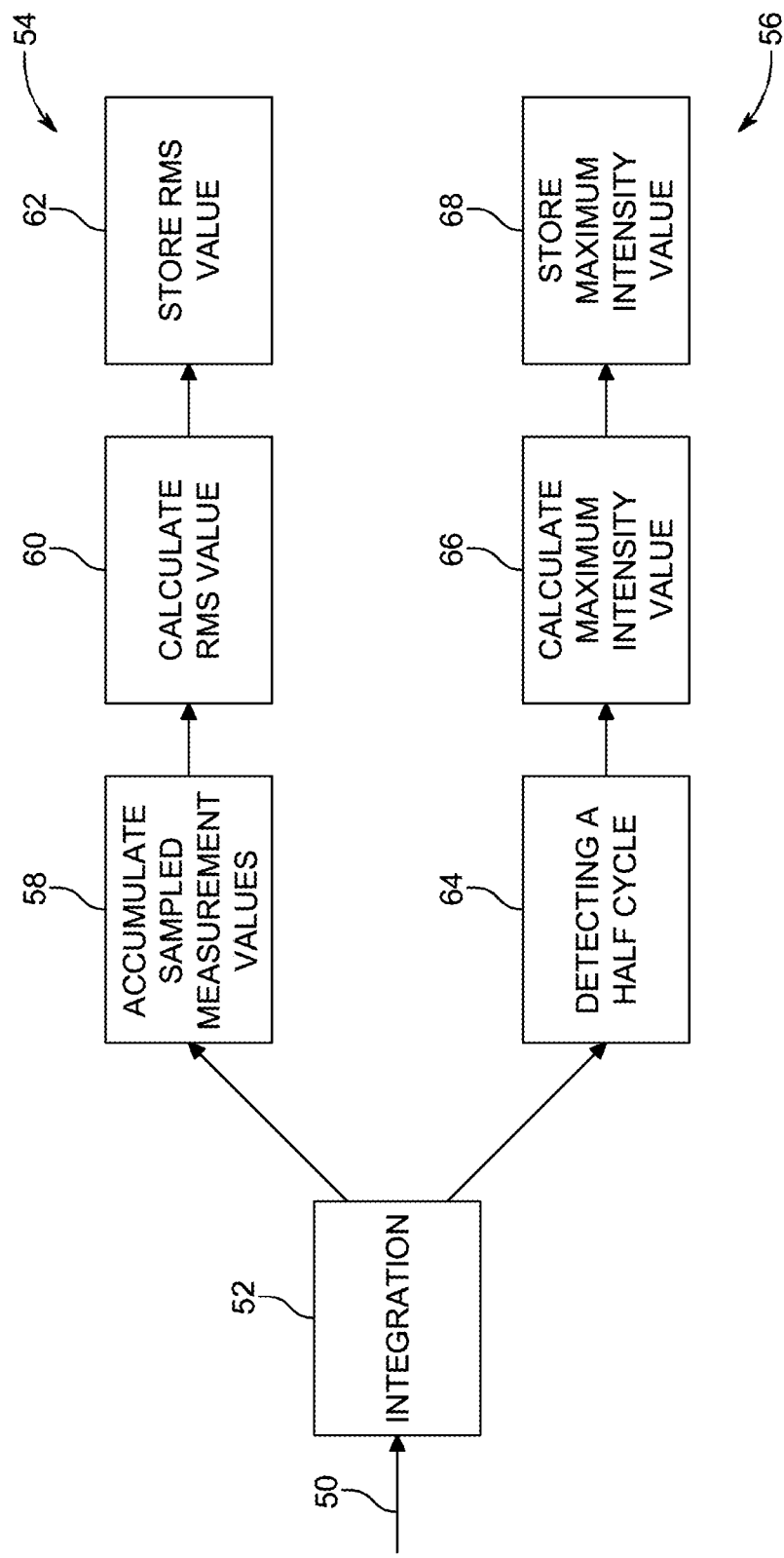
FIG. 4 is a flowchart of a method for measuring an electrical current by means of the measurement subsystem from FIG. 2.

FIG. 4 shows an example of the operation of the auxiliary device 6 and of the unit 28 when an alternating electrical current is present in the conductor 8 under surveillance, for example before tripping of the protection device 4.

First of all, the device 6 measures the intensity of the alternating electrical current circulating in the electrical conductor 8 using the sensor 20 and the measurement subsystem 16.

The arrow 50 represents a current measurement signal received at the input 29. For example, the received measurement signal is a sampled signal that comes from the converter 26.

According to an illustrative and not necessarily limiting embodiment, the sampling frequency of the measurement signal is chosen to be equal to 2 kHz, which corresponds to 40 samples per 50 Hz cycle.

According to variants, the sampling frequency may be different. In practice, the sampling frequency is generally chosen as a function of the frequency of the alternating current.

In some cases, depending on the type of sensor 20 used, the signal received represents the temporal drift of the current. This is notably the case when the sensor 20 is a Rogowski torus. In this case, in a step 52, the unit 28 digitally integrates the values received to obtain a value directly representing the intensity. The step 52 is omitted when the sensor 20 supplies directly a value representing the instantaneous intensity.

Thereafter, the unit 28 automatically calculates values representing the measured electrical current, said representative values each being calculated on the basis of the intensity values measured during a predefined time interval.

The calculated values are then stored in memory 36, 38 of the device 6.

Measurement, calculation and storage are carried out repeatedly and/or continuously for as long as an electrical current circulates in said electrical conductor 8.

Several types of value representing the electrical current can be calculated from the measured values. The time intervals may have a particular duration for each type of representative value.

According to embodiments, the values representing the electrical current include the maximum intensity of the measured current, denoted $I_{PEAK}$, and the RMS value of the measured current, denoted $I_{RMS}$.

A plurality of maximum intensity values $I_{PEAK}$ are calculated for a plurality of respective first successive time intervals on the basis of the intensity values measured by the sensor 20 during each of these first time intervals.

A plurality of RMS values $I_{RMS}$ are calculated for a plurality of respective first successive time intervals on the basis of the intensity values measured by the sensor 20 during each of these second time intervals.

Calculation and storage are carried out in parallel for example and independently of one another for these two types of values representing the electrical current, as shown by the two branches 54 and 56 in FIG. 4.

According to examples, the duration of the time intervals is proportional to the period of the alternating electrical current circulating in said electrical conductor 8.

For example, for an electrical installation 2 operating at a nominal frequency of 50 Hz, the period of the alternating electrical current is equal to 20 ms.

By way of illustrative and not necessarily limiting example, each first time interval has a duration equal to one half-period of the electrical current and each second time interval has a duration equal to two periods. These values may be chosen differently, in particular as a function of the properties of the installation 2 or of the supply 10.

The first and second time intervals are preferably synchronized with the periodic half-cycles of the measured alternating electrical current, for example so that each first time interval coincides with a half-cycle of oscillation of the measured alternating electrical current. According to these examples, the beginning of each first or second time interval therefore coincides with a passage through zero of the alternating electrical current. The alternating electrical current circulating in the conductor 8 has a sinusoidal shape for example.

In the example shown, calculating each RMS value $I_{RMS}$ includes a step 58 of accumulating sampled measurement values in a working memory of the unit 28, for example in the memory 34. Then, when measured values have accumulated for a duration equal to the second time interval, the corresponding RMS value $I_{RMS}$ is calculated automatically by the processor 30 from the accumulated values during a step 60. The accumulated values can thereafter be reinitialized.

Thereafter, during a step 62, the calculated RMS value $I_{RMS}$ is stored in the second buffer memory 38. In the example shown, the buffer memory 38 is able to store at least five RMS values $I_{RMS}$ and the oldest values are overwritten when a new value is stored.

In parallel with this, in the example shown, calculating each maximum intensity value $I_{PEAK}$ includes a step 64 of detecting a half-cycle of the measured alternating electrical current.

When the half-cycle has been detected, the unit 28 counts down a duration corresponding to the first time interval and then, during a step 66, automatically calculates the maximum intensity value or peak value $I_{PEAK}$ among the measured intensity values for this duration.

Thereafter, during a step 68, the calculated maximum intensity value $I_{PEAK}$ is stored in the first buffer memory 36.

In the example shown, the buffer memory 36 is able to store at least eight maximum intensity values $I_{PEAK}$ and the oldest values are overwritten when a new value is stored.

According to variants, the size of the buffer memories 36 and 38 may be greater than that indicated. For example, each buffer memory 36 and 38 may enable storage of at least 10 values or at least 20 calculated values. The larger the buffer memories 36 and 38, the more reliable the detection method, because the diagnosis is then based on a greater number of stored values, as will be clear hereinafter.

In practice, the choice of the size of the memories 36 and 38 is the result of a compromise between the requirements of diagnostic reliability and the hardware limitations of the unit 28.

An example of execution by the unit 28 of a method for diagnosing the cause of tripping of the device 4 is described next with reference to FIGS. 5, 6, 7 and 8. As explained above, this method is described with reference to only one phase of the installation 2.

First of all, the device 4 is tripped and interrupts the circulation of the electrical current in the electrical conductor 8 under surveillance.

For example, tripping is caused by the tripping device detecting an electrical fault in the installation 2 such as a short circuit or an overload.

In a step S100 the device 6 automatically detects the loss of electrical power in the conductor 8. Hereinafter, the expressions "loss of voltage" and "loss of supply" are used interchangeably.

For example, a detection device, such as a voltage sensor in the device 6, not shown, detects loss of the voltage between the conductor 8 and a reference potential. Alternatively, loss of power is detected thanks to the measurements from the sensor 20.

In some embodiments, at this stage, the measuring, calculation and storage steps described above may be interrupted.

Thereafter, the unit 28 automatically determines the type of electrical fault that is the source of the tripping of the device 4 from calculated values stored in the memories 36 and 38.

According to embodiments, the unit 28 uses a first method to determine if the electrical fault is a short circuit and, in parallel, a second method to determine if the electrical fault is an overload.

For example, in the first method the unit 28 compares with a first threshold value the largest value $I_{PEAK-MAX}$ of the maximum intensity of the current $I_{PEAK}$ among the values $I_{PEAK}$ stored for a plurality of measurement intervals preceding the loss of electrical power, a short circuit being diagnosed if the largest value of the maximum intensity is greater than the first threshold value.

Figure 6:
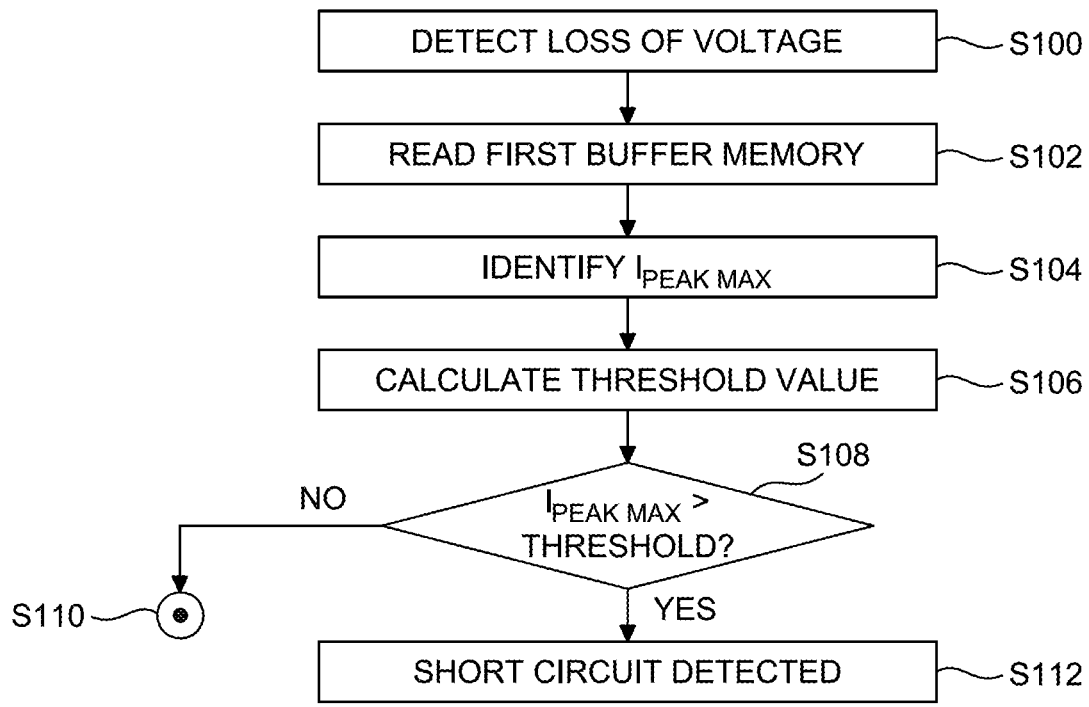
FIG. 6 is a flowchart of a diagnostic method for detecting if an interruption of the current in the electrical system from FIG. 1 is due to a short circuit.

Accordingly, as shown in the FIG. 6 example, following the step S100 of detecting the loss of power, the values $I_{PEAK}$ previously calculated and stored in memory are read in a step S102, after which the maximum value $I_{PEAK-MAX}$ of all these values $I_{PEAK}$ is identified automatically in a step S104.

The first threshold value is advantageously calculated automatically, after the detection of loss of electrical power, here in a step S106 after the steps S102 and S104, as a function of the values $I_{PEAK}$ previously stored in the memory 36. According to embodiments, in the step S106, calculating the first threshold value includes determining the largest value $I_{PEAK-MAX}$ and the smallest value $I_{PEAK-MIN}$ of the intensity $I_{PEAK}$ among the values stored in the buffer memory 36. For example, the largest value $I_{PEAK-MAX}$ is that determined in the step S102.

Thereafter, the mean value between the smallest value $I_{PEAK-MIN}$ and the largest value $I_{PEAK-MAX}$ previously determined is calculated automatically, for example by means of the formula $(I_{PEAK-MAX}+I_{PEAK-MIN})/2$, the first threshold value being defined as equal to this calculated mean value.

Figure 5:
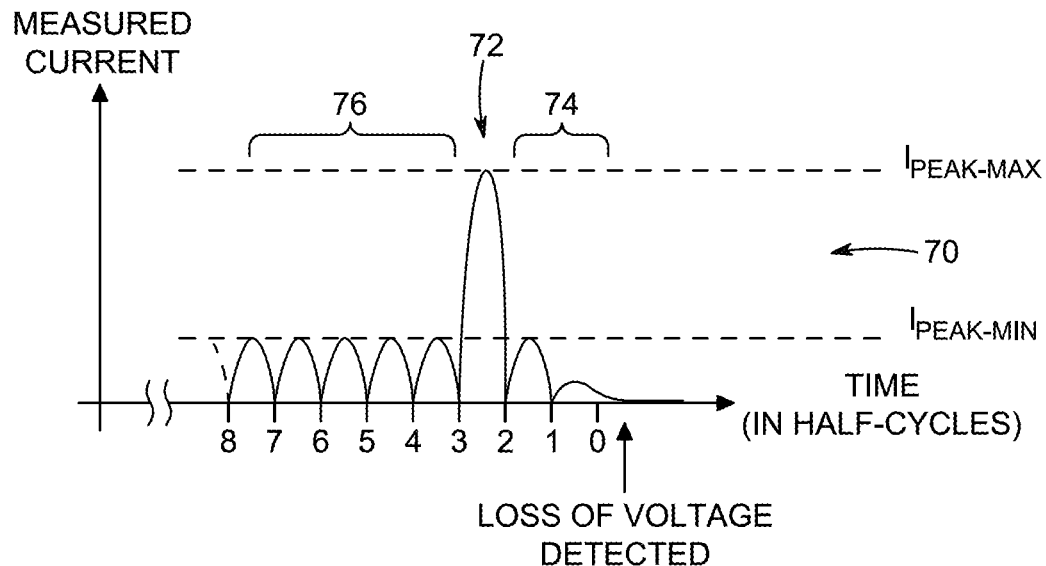
FIG. 5 is a graph representing the intensity value of a electrical current measured as a function of time by the measurement subsystem from FIG. 2 prior to an interruption of the current.

With reference to calculating the first threshold value, FIG. 5 shows diagrammatically, for explanatory purposes, a curve 70 illustrating the evolution of the alternating electrical current in the moments preceding the loss of electrical power.

In FIG. 5, the abscissa axis corresponds to time, expressed in half-cycles numbered consecutively and decreasingly up to the loss of electrical power. The ordinate axis corresponds to the intensity of the current, expressed in arbitrary units.

Only eight half-cycles are represented on the abscissa axis, corresponding to the eight values $I_{PEAK}$ stored in the first buffer memory 36. For each half-cycle, the maximum value of the current corresponds to the value $I_{PEAK}$ stored in the first buffer memory 36. The half-cycles preferably correspond to the first time intervals.

The reference 72 designates a time interval for which the current has a maximum value. For example, that maximum value corresponds to the electrical fault causing tripping and occurs before detecting the loss of power. In practice, if an electrical fault occurs in the installation 2, the tripping of the device 4 is not instantaneous and a certain delay elapses between measuring the electrical fault and detecting the loss of power by the module 6. Here it is seen that after the current peak observed for the interval 72, the alternating current decreases in amplitude and finishes by becoming zero.

The reference 74 designates time intervals after the time interval 72 and before detecting loss of power.

The time reference 76 designates the time intervals before the interval 72 and for which the values $I_{PEAK}$ are stored in the first buffer memory 36.

According to advantageous but nevertheless optional embodiments of the step S106, the values $I_{PEAK}$ stored in the first buffer memory 36 that are associated with the intervals 74 after the interval 72 corresponding to the largest value $I_{PEAK-MAX}$ are ignored for determining the smallest value $I_{PEAK-MIN}$.

Accordingly, the smallest value $I_{PEAK-MIN}$ is determined among only the values $I_{PEAK}$ stored in the memory 36 that correspond to the intervals 76 before the interval 72. This makes it possible to prevent parasitic variations of the current being taken into account in calculating the first threshold value. In fact, in some cases, when the installation 2 is connected to certain types of electrical load 12, in particular inductive loads such as electric motors, a residual electrical voltage may be present between the conductors 8 downstream of the device 4 after the device 4 trips. This therefore enables a more reliable diagnosis to be obtained.

According to optional variants of the first method, no short circuit is diagnosed if the largest value $I_{PEAK-MAX}$ is less than twice the smallest value $I_{PEAK-MIN}$. In other words, if after the step S106 the largest value $I_{PEAK-MAX}$ is less than twice the smallest value $I_{PEAK-MIN}$ then the first method is interrupted without a short circuit being diagnosed. This enables prevention of an erroneous diagnosis of a short circuit in a situation where the electrical current fluctuates around the value of the current close to the overload current. This therefore enables a more reliable diagnosis to be obtained.

According to various variants, the first threshold value may be calculated differently. The first threshold value may also be a predefined value that is not recalculated afterwards. In this case the step S106 is omitted.

Returning to FIG. 6, in a step S108 after the step S104 and where applicable after the step S106 the unit 28 automatically compares the value $I_{PEAK-MAX}$ with the first threshold value.

If the value $I_{PEAK-MAX}$ is less than or equal to the first threshold value, then no short circuit is detected and the first method ends in a step S110.

If the value $I_{PEAK-MAX}$ is greater than the first threshold value then a short circuit is said to be detected and the first method ends in a step S112.

In other words, it suffices here for one or two values $I_{PEAK}$ stored in the memory 36 to be greater than the first threshold value for a short circuit to be diagnosed.

According to optional embodiments, a short circuit is diagnosed only if, additionally, the largest value $I_{PEAK-MAX}$ is greater than or equal to twice the rated current value $I_n$ of the protection device 4. For example, the rated current value $I_n$ of the protection device 4 is previously entered into memory 34 of the unit 28. Such comparison is for example executed during the step S108 or conjointly with the step S108 or after the step S108.

Thanks to this additional condition, erroneous diagnosis of a short circuit is avoided in a situation where the electrical current fluctuates around low intensity values. The reliability of the diagnosis is therefore improved.

Figure 7:
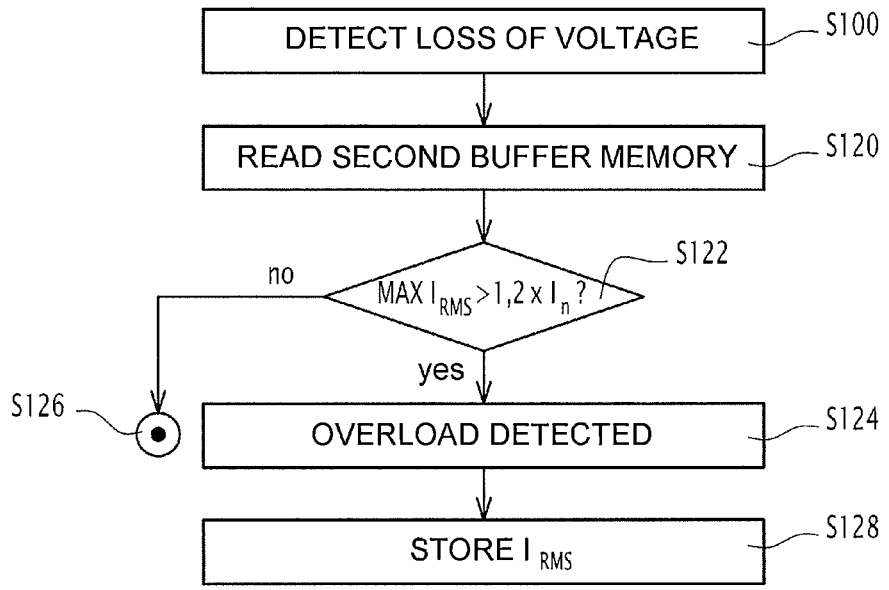
FIG. 7 is a flowchart of a diagnostic method for detecting if an interruption of the current in the electrical system from FIG. 1 is due to an overload.

In parallel with this, in the second method, as shown in FIG. 7, the unit 28 compares with a second threshold value the highest RMS value of the current $I_{RMS}$ among the values stored for a plurality of measurement intervals preceding the loss of electrical power, an overload being diagnosed if the largest RMS value is greater than the second threshold value.

According to embodiments, the second threshold value is chosen to be larger than the rated current value $I_n$ of the protection device 4 and smaller than twice said rated current value $I_n$. The second threshold value is preferably equal to 1.2 times the rated current value $I_n$. For example, the rated current value $I_n$ of the protection device 4 is previously entered in the memory 34 of the unit 28.

Accordingly, after the step S100 of detecting loss of power, the RMS values $I_{RMS}$ stored in the second buffer memory 38 are read in a step S120, after which the maximum value $I_{RMS-MAX}$ of all the stored these RMS values $I_{RMS}$ is identified automatically.

In a step S122 after the step S120, the unit 28 automatically compares the maximum value $I_{RMS-MAX}$ with the second threshold value.

If the maximum value $I_{RMS-MAX}$ is greater than the second threshold value, then an overload is diagnosed in a step S124.

If the maximum value $I_{RMS-MAX}$ is less than or equal to the second threshold value then no overload is detected and the second method ends in a step S126.

If an overload is diagnosed in the step S124, then the corresponding maximum value $I_{RMS-MAX}$ is advantageously stored in the memory 40 of the unit 28 in a step S128.

Accordingly, after the first and second methods, it is possible to have available diagnostic information on the cause of tripping of the device 4 that is the source of the loss of electrical power, in particular to know whether this tripping was caused by a short circuit or by an overload.

In situations where none of the methods has enabled identification of the cause as being a short circuit or an overload, it is possible that the tripping was caused by manual action of a user on the control lever of the device 4.

According to embodiments that are not shown, after a diagnosis is established (for example at the end of the steps S110 or S112 and S124 or S126) a diagnostic message representing the type of electrical fault diagnosed is sent by the device 6.

For example, the diagnostic message is sent to the radio concentrator 14 by means of the wireless communication interface 44. According to examples, the radio concentrator 14 is configured to relay the received message to a remote computer server, for example by means of a long-range radio link or by way of a computer network such as a local area network or the Internet network.

Instead and/or additionally, diagnostic information representing the type of electrical fault diagnosed is stored in a memory 40 of the auxiliary device 6.

For example, the diagnostic information stored in memory can be consulted by a user by means of the interface 42. According to examples, the diagnosed cause of tripping is displayed by means of a screen or an indicator light of the interface 42.

Figure 8:
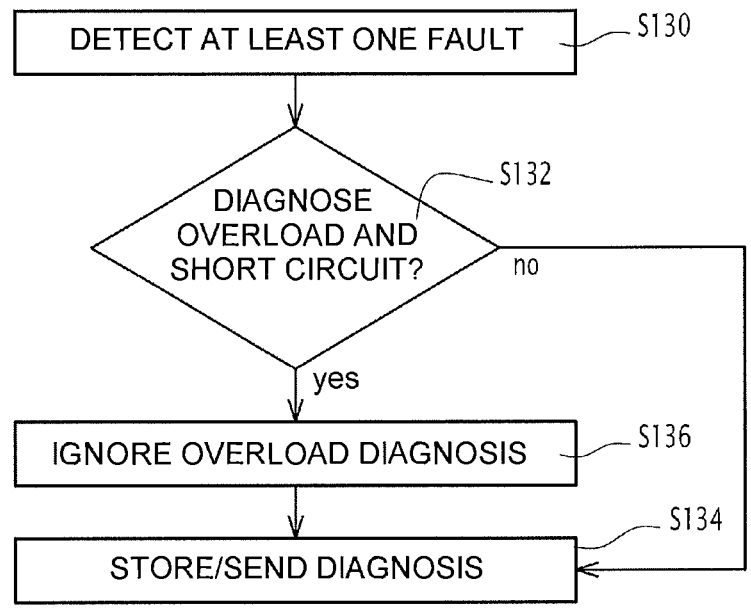
FIG. 8 is a flowchart showing a variant of the diagnostic method from FIGS. 6 and 7.

According to optional embodiments, shown in FIG. 8, when at least one electrical fault of short circuit or overload type has been diagnosed after executing the first and/or second method(s) (step S130), the unit 28 automatically verifies in a step S132 if two faults of short circuit and overload type have been diagnosed.

If only one electrical fault of short circuit and overload type has been diagnosed, then the diagnosis is validated in a step S134 and may be sent and/or stored as described above.

If two faults of short circuit and overload type have been diagnosed, then the diagnostic is corrected in a step S136 in order to ignore the overload diagnosis and in order to retain only the short circuit diagnosis.

In other words, when determining a type of electrical fault has led to detecting both a short circuit and an overload, only the detection of the short circuit is taken into account, the detection of the overload then being automatically ignored in this case.

In this example, in the step S136, the diagnostic information that it has been possible to store in memory 40 at the end of execution of the second method in the step S128 is automatically deleted.

Ignoring the overload diagnosis in the situation where two causes are diagnosed simultaneously enables a more reliable diagnosis to be obtained. In fact, when a short circuit occurs, an overload may be accidentally diagnosed even if a short circuit has been correctly diagnosed.

The invention enables diagnosis of the cause of tripping of the protection device 4 thanks to the auxiliary device 6. The device 6 is independent of the tripping device of the device 4 and the diagnosis is produced without needing to know the status of the tripping device of the device 4. Implementing the diagnostic function in existing electrical installations is therefore facilitated, because a function of this kind may be integrated simply by associating the auxiliary device 6 with the conductors 8 and without needing to replace all or part of the protection devices of the installation 2.

Moreover, the embodiments of the methods described hereinabove enable a more reliable diagnosis to be effected of the cause of the tripping of the device 4 than some methods implemented by measuring devices.

In fact, some methods for diagnosing the cause of tripping used by auxiliary devices and based on measuring the waveform of the measured alternating current exhibit a risk of erroneous detection in certain circumstances, notably in the event of saturation of the current sensor, because the waveform of the measurement signal in a situation of this kind may incorrectly be confused with the signature of an overload current in the installation 2. This is not the case thanks to the invention, because the identification of the cause of the electrical fault is based on specific representative values that have been the subject of a calculation.

Moreover, with these methods there exists a risk that the diagnosis cannot be made if tripping follows shortly after starting up the auxiliary device tasked with the measurement if the detection method has not had time to initialize completely.

This is not the case thanks to the invention, in particular because identifying the cause of the electrical fault is based on values representing the measured current that have been stored beforehand for a plurality of time intervals preceding the loss of power.

The embodiments and the variants envisaged hereinabove may be combined with one another to generate new embodiments.

The invention claimed is:

1. A method for diagnosing a cause of tripping of an electrical protection device, wherein the method comprises:
    measuring an intensity of an alternating electrical current circulating in at least one electrical conductor m an electrical installation including an electrical protection device, with a current sensor of an auxiliary device associated with the at least one electrical conductor;
    an electronic processing circuit of the auxiliary device calculating values representing the measured electrical current, the values being each calculated from intensity values measured during a predefined time interval, the values including a first value being a maximum intensity of the measured current and a second value being an RMS value of the measured electrical current; and
    storing the calculated values in a memory of the auxiliary device,
    wherein the measuring, calculating, and storing steps are performed repeatedly for as long as an electrical current circulates in said at least one electrical conductor so that a plurality of the first values and a plurality of the second values are stored; and
    wherein the method further comprises, after detection by the auxiliary device of a loss of electrical power in said at least one conductor, determining a type of electrical fault from the plurality of the stored first and second values, the determining step including
    comparing, with a first threshold value, a largest value of the maximum intensity of the current as determined from the plurality of stored first values for a corresponding plurality of time intervals preceding the loss of the electrical power, a short circuit being diagnosed when determining that the largest value of the maximum intensity is greater than the first threshold value; and
    comparing, with a second threshold value, a largest RMS value of the current as determined from the plurality of stored second values for the corresponding plurality of time intervals preceding the loss of electrical power, an overload being diagnosed when determining that the largest RMS value is greater than the second threshold value;
    wherein the first threshold value is a mean value of a smallest value and the largest value determined from the maximum intensity of the current.

2. The method according to claim 1, further comprising calculating the first threshold value automatically, after detection of the loss of electrical power, as a function of the maximum intensity values of the measured current previously stored for the corresponding plurality of time intervals preceding the detection of loss of electrical power.

3. The method according to claim 2, wherein calculating the first threshold value further comprises:
    determining the largest value of the maximum intensity of the current from the maximum intensity of the current among the first values stored for the corresponding plurality of time intervals preceding the loss of electrical power;
    determining the smallest value of the maximum intensity of the current from the first values stored for the corresponding plurality of time intervals preceding the loss of electrical power; and calculating the mean value between the smallest value and the largest value determined from the maximum intensity of the current, the first threshold value being defined as equal to the calculated mean value.

4. The method according to claim 3, wherein calculating the first threshold value further comprises ignoring the stored first values of the maximum intensity of the current that are associated with time intervals after the time interval corresponding to the largest value determined of the maximum intensity of the current when determining the smallest value, the smallest value of the maximum intensity of the current being determined from only the stored first values corresponding to time intervals before the time intervals corresponding to the largest value determined.

5. The method according to claim 3, wherein the determining the type of the electrical fault further comprises not diagnosing the short circuit when the largest value determined of the maximum intensity of the current is less than twice the smallest value determined of the maximum intensity of the current.

6. The method according to claim 1, wherein determining the type of the electrical fault further comprises diagnosing the short circuit only when, additionally, the largest value of the maximum intensity of the current among the first values stored for the corresponding plurality of time intervals preceding the loss of the electrical power is greater than or equal to twice a rated current value of the electrical protection device.

7. The method according to claim 6, wherein the second threshold value is higher than the rated current value and less than twice said rated current value of the electrical protection device.

8. The method according to claim 1, wherein, when the determining the type of the electrical fault diagnoses both the short circuit and the overload, only the detection of the short circuit is taken into account, while the detection of the overload is automatically ignored.

9. The method according to claim 1, further comprising, when diagnosing the overload, storing in the memory of the auxiliary device, the largest RMS value of the measured electrical current.

10. The method according to claim 1, further comprising after determining the type of the electrical fault, sending a diagnostic message representing the determined type of the electrical fault to a concentrator via a wireless communication interface of the auxiliary device and/or storing, in the memory of the auxiliary device, diagnostic information representing the type of the determined electrical fault.

11. The method according to claim 1, wherein a duration of each of the plurality of time intervals is proportional to a period of the alternating electrical current circulating in the at least one electrical conductor.

12. An auxiliary device for an electrical installation comprising the electrical protection device associated with the at least one electrical conductor, the auxiliary device including the current sensor associated with the at least one electrical conductor, the electronic processing circuit, and the memory, wherein the auxiliary device is configured to perform the method for diagnosing the cause of the tripping of the electrical protection device according to claim 1.

13. An electrical system comprising the electrical protection device and the auxiliary device associated with the at least one electrical conductor of the electrical installation, the electrical protection device being configured to interrupt the circulation of the electrical current in the at least one electrical conductor when detecting the electrical fault, wherein the auxiliary device is the device according to claim 12.

14. The method of claim 1, wherein the determining the type of the electrical fault comprises performing the comparing steps in parallel such that both comparing steps are always performed unconditionally.

* * * * *